(12) United States Patent
Toda et al.

(10) Patent No.: US 6,931,203 B2
(45) Date of Patent: Aug. 16, 2005

(54) VAPORIZER FOR MOCVD AND METHOD OF VAPORIZING RAW MATERIAL SOLUTIONS FOR MOCVD

(75) Inventors: Masayuki Toda, Yamagata-ken (JP); Masaki Kusuhara, Chuo-ku (JP); Mikio Doi, Chuo-ku (JP); Masaru Umeda, Chuo-ku (JP); Mitsuru Fukagawa, Chuo-ku (JP); Yoichi Kanno, Miyagi-ken (JP); Osamu Uchisawa, Miyogi-ken (JP); Kohei Yamamoto, Miyagi-ken (JP); Toshikatu Meguro, Miyagi-ken (JP)

(73) Assignee: Kabushiki Kaisha Motoyama Seisakusho, Miyagi-ken (JP)

( * ) Notice: Subject to any disclaimer, the term of this patent is extended or adjusted under 35 U.S.C. 154(b) by 0 days.

(21) Appl. No.: 10/310,564

(22) Filed: Dec. 5, 2002

(65) Prior Publication Data

US 2003/0221625 A1 Dec. 4, 2003

Related U.S. Application Data

(62) Division of application No. 09/488,764, filed on Jan. 21, 2000, now Pat. No. 6,540,840.

(30) Foreign Application Priority Data

Jan. 22, 1999 (JP) .............................................. 11-14970

(51) Int. Cl.[7] .......................... F22B 29/06; F02M 15/04
(52) U.S. Cl. ...................................... 392/397; 261/142
(58) Field of Search ................................. 392/386, 387, 392/394, 396, 397; 118/726; 261/142, 146, 147; 239/135, 136, 310, 311

(56) References Cited

U.S. PATENT DOCUMENTS

| 3,689,237 | A | * | 9/1972 | Stark et al. ................... 48/190 |
| 4,111,365 | A | | 9/1978 | Kimbara |
| 4,815,665 | A | * | 3/1989 | Haruch ....................... 239/432 |
| 4,847,469 | A | | 7/1989 | Hofmann et al. |
| 5,372,754 | A | * | 12/1994 | Ono ............................. 261/142 |
| 5,882,416 | A | | 3/1999 | Van Buskirk et al. |
| 6,036,783 | A | | 3/2000 | Fukunaga et al. |
| 6,062,499 | A | | 5/2000 | Nakamura et al. |
| 6,210,485 | B1 | | 4/2001 | Zhao et al. |
| 6,258,170 | B1 | | 7/2001 | Somekh et al. |
| 6,470,144 | B1 | * | 10/2002 | Tarutani et al. ............. 392/396 |

* cited by examiner

Primary Examiner—Sang Y. Paik
(74) Attorney, Agent, or Firm—Randall J. Knuth

(57) ABSTRACT

Disclosed is a vaporizer constituted of a dispersing section 8 and a vaporizing section 22. The dispersing section 8 comprises a gas introduction port 4 for introducing a carrier gas 3 under pressure into a gas passage, means for feeding raw material solutions 5a and 5b to the gas passage, and a gas outlet 7 for delivering the carrier gas containing the raw material solutions to the vaporizing section 22. The vaporizing section 22 comprises a vaporizing tube 20 having one end connected to a reaction tube of the MOCVD system and having the other end connected to the gas outlet 7 of the dispersing section 8, and heating means for heating the vaporizing tube 20. The vaporizing section 22 serves to heat and vaporize the raw material solution containing carrier gas 3 delivered from the dispersing section 8. The dispersing section 8 includes a dispersing section body 1 having a cylindrical hollow portion, and a rod 10 having an outer diameter smaller than the inner diameter of the cylindrical hollow portion. The rod 10 has a spiral groove 60 formed in the external periphery closer to the vaporizing section 22, the rod 10 being inserted into the cylindrical hollow portion.

5 Claims, 12 Drawing Sheets

VAPORIZER FOR MOCVD AND METHOD OF VAPORIZING RAW MATERIAL SOLUTIONS FOR MOCVD

CONTINUATION APPLICATION

This application is a divisional application, which hereby claims the benefit under Title 35, United States Code §119 (e) U.S. Pat. No. 6,540,840 application Ser. No. 09/488,764, filed on Jan. 21, 2000 now U.S. Pat. No. 6,540,840.

BACKGROUND OF THE INVENTION

1. Field of the Invention

The present invention relates to a vaporizer for MOCVD and a method of vaporizing raw material solutions for MOCVD.

2. Description of the Related Arts

Problematic in the development of DRAMs is a reduction in storage capacitance resulting from the miniaturization. Any measures are needed since the capacitance has to be level with that in the precedent generation from the viewpoint of software errors or the like. As a measure for this, increase in the capacitor area has been aimed at by introducing a three-dimensional structure referred to as a stack structure or a trench structure for cell structures exceeding 4M in addition to the planer structure for 1M or less. A dielectric film has also been employed which consists of a thermal oxide film and a CVD nitride film laminated on the poly-Si from the thermal oxide film of the substrate Si (this laminated film is referred to commonly as an ON film). For 16M DRAM, in order to further increase the area contributing to the capacitance, there have been introduced stack types such as a thick-film type making use of the side or a fin type utilizing the back of the plate as well.

Such three-dimensional structures have disadvantageously given rise to an increase in the stages due to the complicated process and a reduction in the yield due to the increased steps, rendering the realization in 256 Mbits or larger DRAMs difficult. For this reason, conceived as one way to further increase the integration degree without altering the current DRAM structures was a switching of the capacitance dielectrics to ferroelectrics having a higher dielectric constant. First attention was paid as a dielectric thin film having a high dielectric constant to a thin film of high-dielectric-constant single-metal paraelectric oxides such as $Ta_2O_5$, $Y_2O_3$ and $HfO_2$. The relative dielectric constants of $Ta_2O_5$, $Y_2O_3$ and $HfO_2$ are of the order of 28, 16, 24, respectively, which are four to seven times that of $SiO_2$.

Nevertheless, application to 256M or larger DRAMs necessitates a three-dimensional capacitor structure. $(Ba_xSr_{1-x})TiO_3$, $Pb(Zr_yTi_{1-y})O_3$ and $(Pb_aL_{1-a})(Zr_bTi_{1-b})O_3$ are promising as materials having a higher relative dielectric constant than the above oxides and expected to be applicable to DRAMs. Similarly promising is a Bi-based laminar ferroelectric material having a crystal structure extremely resembling the superconductor. From the viewpoint of low-tension drive and good fatigue characteristics, remarkable attention is being paid recently to $SrBi_2TaO_9$ referred to as Y1 material in particular.

The formation of $SrBi_2TaO_9$ ferroelectric thin film is typically carried out by means of practical and promising MOCVD (metal organic chemical vapor deposition).

Raw materials of the ferroelectric thin film are typically three different organometallic complexes, Sr $(DPM)_2$, $Bi(C_6H_5)_3$ and $Ta(OC_2H_5)_5$, which are each dissolved in THF (tetrahydrofuran) solvent for use as a solution. DPM is an abbreviation of dipivaloylmethane.

Table 1 shows the respective material characteristics.

TABLE 1

| | BOILING POINT(° C.)/PRESSURE (mmHg) | MELTING POINT(° C.) |
|---|---|---|
| Sr $(DPM)_2$ | 242/14 | 78 |
| Bi $(C_6H_5)_3$ | 270~280/1 | 201 |
| Ta $(OC_2H_5)_5$ | 146/0.15 | 22 |
| THF | 67 | −109 |

The system for use in MOCVD comprises a reacting section for subjecting $SrBi_2TaO_9$ thin film raw material to a gas phase reaction and a surface reaction for film deposition, a feeding section for feeding $SrBi_2TaO_9$ thin film raw material and an oxidizing agent to the reacting section, and a collecting section for collecting reaction products obtained in the reacting section.

The feeding section is provided with a vaporizer for vaporizing the thin film raw material.

Known techniques related to the vaporizer are illustrated in FIG. 12. FIG. 12A shows a so-called metal filter method in which a raw material solution heated to a predetermined temperature is drip fed to a metal filter used with the aim of increasing the area of contact between the ambient gas and the $SrBi_2TaO_9$ ferroelectric thin film raw material solution.

This technique however has a deficiency that the metal filter may become clogged after several-times vaporizations, making the long-term use difficult.

FIG. 12B depicts a technique in which 30 kgf/cm² of pressure is applied to a raw material solution so as to allow the raw material solution to be emitted through 10 $\mu$m pores and expanded for evaporation, This technique however entails a problem that the pores may become clogged as a result of several-times operations, rendering it difficult to endure the long-term use.

In the event that the raw material solution is a mixture solution of a plurality of organometallic complexes, e.g., $Sr(DPM)_2$/THF, $Bi(C_6H_5)_3$/THF and $Ta(OC_2H_5)_5$/THF and that this mixture solution is vaporized by heating, the solvent (THF in this case) having a highest vapor pressure will be vaporized earlier, with the result that the organometallic complexes may be deposited and adhered onto the heated surfaces, blocking a stable feed of raw materials to the reacting section.

Furthermore, it is demanded in order to obtain a film having a good uniformity by MOCVD that there should be presented a vaporized gas within which the raw material solutions have uniformly been dispersed. However, the above prior art has not necessarily met such a demand.

SUMMARY OF THE INVENTION

It is therefore an object of the present invention to provide a vaporizer for MOCVD capable of long-term use without causing any clogging or other inconveniences and ensuring a stable feed of raw materials to the reacting section.

Another object of the present invention is to provide a vaporizer for MOCVD and a method of vaporizing raw material solutions for MOCVD, capable of obtaining a vaporized gas containing uniformly dispersed raw material solutions.

According to a first aspect of the present invention there is provided a vaporizer for MOCVD having a dispersing section and a vaporizing section, wherein the dispersing section comprises a gas passage formed in the interior, a gas introduction port for introducing a carrier gas under pressure into the gas passage, means for feeding a raw material solution to the gas passage, a gas outlet for delivering the carrier gas containing the raw material solution to the vaporiziny section, and means for cooling the gas passage, and where in the vaporizing section comprises a vaporizing tube having one end connected to a reaction tube of an MOCVD system and having the other end connected to the gas outlet of the dispersing section, and heating means for heating the vaporizing tube, the vaporizing section serving to heat and vaporize the raw material solution containing carrier gas delivered from the dispersing section.

According to a second aspect of the present invention there is provided a vaporizer for MOCVD having a dispersing section and a vaporizing section, wherein the dispersing section comprises a gas passage formed in the interior, a gas introduction port for introducing a carrier gas under pressure into the gas passage, means for feeding a raw material solution to the gas passage, and a gas outlet for delivering the carrier gas containing the raw material. solution to the vaporizing section, and wherein the vaporizing section comprises a vaporizing tube having one end connected to a reaction tube of an MOCVD system and having the other end connected to the gas outlet of the dispersing section, and heating means for heating the vaporizing tube, the vaporizing section serving to heat and vaporize the raw material solution containing carrier gas delivered from the dispersing section, and wherein the dispersing section includes a dispersing section body having a cylindrical hollow portion, and a rod having an outer diameter smaller than the inner diameter of the cylindrical hollow portion, the rod having at least one spiral groove formed in the external periphery thereof, the rod being inserted into the cylindrical hollow portion.

According to a third aspect of the present invention there is provided a method of vaporizing a raw material solution for MOCVD, comprising the steps of drip-feeding the raw material solution to a gas passage, jetting a carrier gas toward the drip-fed raw material solution at the flow velocity of 50 to 300 m/s to thereby shear and atomize the raw material solution to obtain a raw material gas, and delivering the raw material gas to a vaporizing section for vaporization.

The above and other objects, aspects, features and advantages of the present invention will become more apparent from the following detailed description in light of the accompanying drawings.

DESCRIPTION OF THE INVENTION

Embodiment 1

Figure 1:
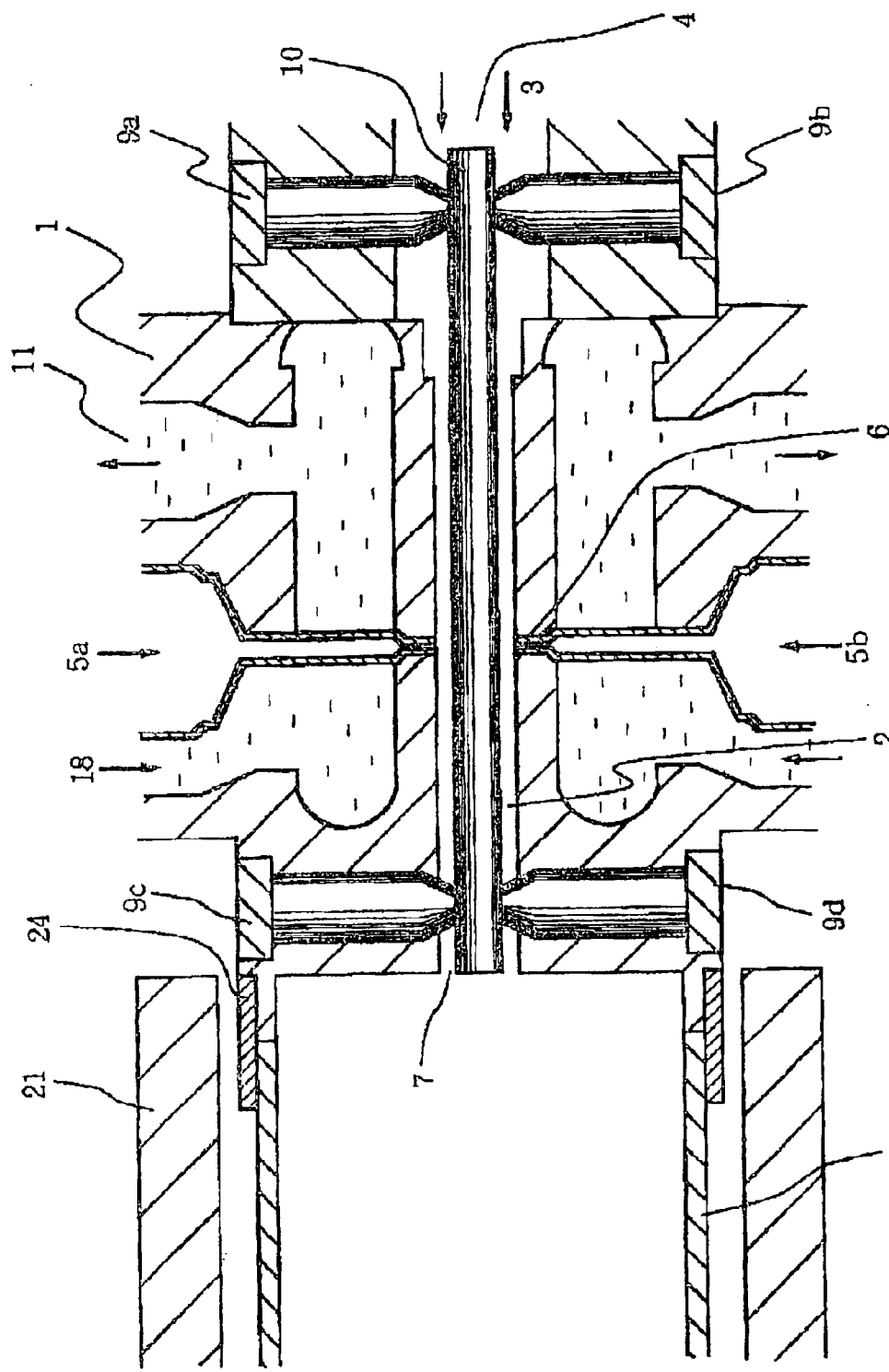
FIG. 1 is a sectional view of the major part of a vaporizer for MOCVD in accordance-with embodiment 1.
Figure 2A:
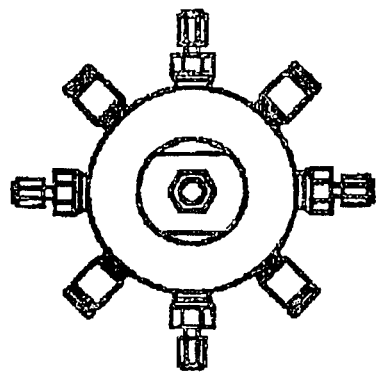
FIGS. 2A and 2B are a longitudinal sectional view and cross-sectional view, respectively, of the vaporizer for MOCVD in accordance with the embodiment 1.
Figure 2B:
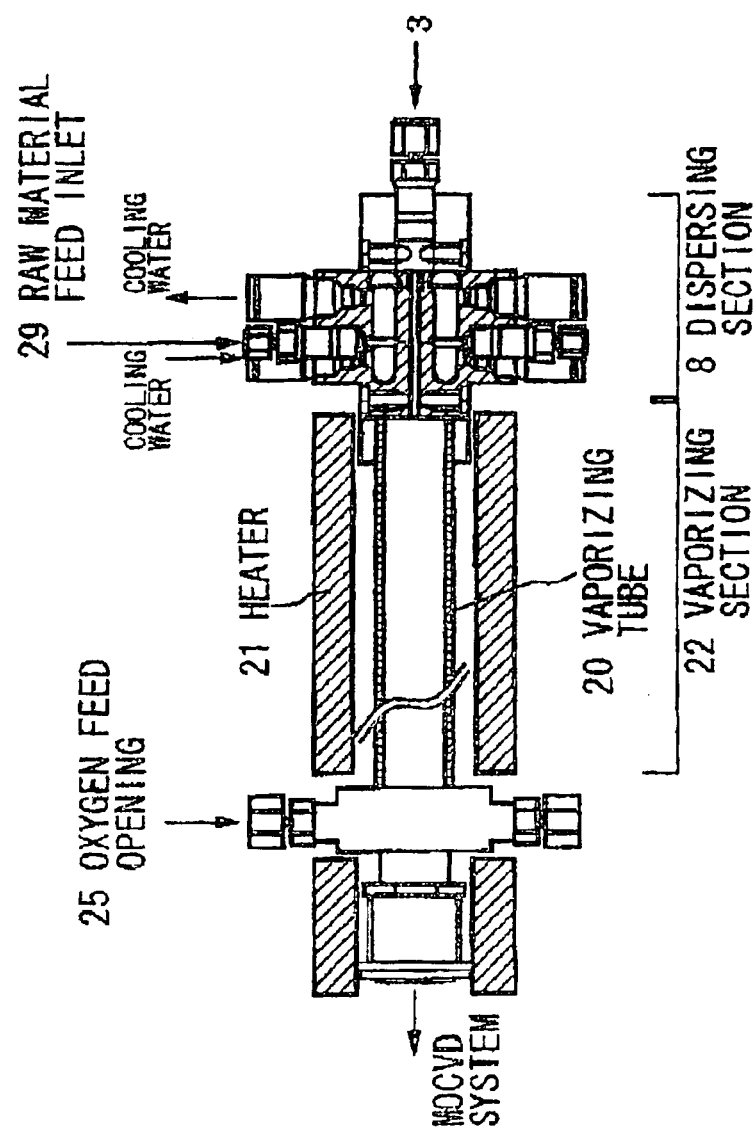

FIG. 1 illustrates a vaporizer for MOCVD in accordance with embodiment 1.

The vaporizer of this embodiment is constituted of a dispersing section 8 and a vaporizing section 22. The dispersing section 8 comprises a gas passage 2 formed in the interior of a dispersing section body 1 constituting the dispersing section 8, a gas introduction port 4 for introducing a carrier gas 3 under pressure into the gas passage 2, means (a raw material feed opening) 6 for feeding a raw material solution 5 to the carrier gas 3 passing through the gas passage 2, a gas outlet 7 for delivering the carrier gas 3 containing the dispersed raw material solution 5 to the vaporizing section 22, and means (cooling water) 18 for cooling the carrier gas 3 flowing through the gas passage 2. The vaporizing section 22 comprises a vaporizing tube 20 having one end connected to a reaction tube of the MOCVD system and having the other end connected to the gas outlet 7 of the dispersing section 8, and heating means (a heater) 21 for heating the vaporizing tube 20. The vaporizing section 22 serves to heat anti vaporize the dispersed raw material solution containing carrier gas 3 delivered from the dispersing section 8.

This embodiment will hereinafter be descried in greater detail.

In this embodiment, a 4.50 mm dia. bore (cylindrical hollow portion) is formed in the interior of the dispersing section body 1. A rod 10 is centered in the bore, the rod 10 having an outer diameter (4.48 mm) smaller than the inner diameter of the bore. The gas passage 2 is formed by a space defined between the dispersing section body 1 and the rod 10. The rod 10 is fixed in position by screws 9a, 9b, 9c and 9d. The gas passage 2 has a width of 0.01 mm.

The width of the gas passage 2 is preferably 0.005 to 0.10 mm. The width less than 0.05 mm may render the machining difficult. The width exceeding 0.10 mm may necessitate use of a high-pressure carrier gas in order to increase the velocity of the carrier gas.

The gas introduction port 4 is provided at one end of the gas passage 2. A source of carrier gas (e.g., $N_2$, Ar) not shown is connected to the gas introduction port 4.

On its side at substantially the middle, the dispersing section body 1 is provided with the raw material feed opening 6 communicating with the gas passage 2 so that the raw material solution 5 can drip down in the gas passage 2 in such a manner as to be dispersed on the carrier gas passing through the gas passage 2.

At the other end of the gas passage 2 is provided the gas outlet 7 which communicates with the vaporizing tube 20 of the vaporizing section 22.

The dispersing section body 1 is formed with a space 11 through which the cooling water 18 flows so that the flow of the cooling water 18 through the space can cool the carrier gas flowing through the interior of the gas passage 2.

Alternatively, this space may be substituted by a Peltier element or the like for cooling. Since the interior of the gas passage 2 of the dispersing section 8 is affected by heat from the heater 21, the solvent of the raw material solution and the organometallic complex will not vaporize at the same time in the gas passage 2 but instead only the solvent may convert to vapor earlier. The possible vaporization of only the solvent is thus prevented by cooling the dispersed solution containing carrier gas flowing through the gas passage 2. It is important in particular to cool the downstream side of the raw material feed opening 6, so that cooling has to be made of at least the downstream side of the raw material feed opening 6. The cooling temperature is set to a temperature equal to or below the boiling point of the solvent. In the case of THF (tetrahydrofuran) For example, the cooling temperature is 67° C. or below. Particular attention is to be paid to the temperature at the gas outlet 7.

Furthermore, cooling of the dispersing section can prevent the interior of the gas passage (gas outlet especially) from being blocked off by carbides during the long-term use.

The dispersing section body 1 is connected to the vaporizing tube 20 downstream of the dispersing section body 1. A fitting 24 provides a connection between the dispersing section body 1 and the vaporizing tube 20 to define a connecting section 23.

The vaporizing section 2.2 consists of the vaporizing tube 20 and the heating means (heater) 21. The heater 21 serves to heat and vaporize the carrier gas containing the dispersed raw material solution flowing through the interior of the vaporizing tube 20, The heater 21 can be for example the Peltier element attached to the external periphery of the vaporizing tube 20.

The vaporizing tube 20 is made preferably of stainless steel such as SUS316L for example. The dimensions of the vaporizing tube 20 can be determined in an appropriate manner as of ¾ inches in outer diameter and of 100 mm in length, The vaporizing tube 20 is connected at its downstream end to the reaction tube of the MOCVD system and is provided in this embodiment with an oxygen feed opening 25 serving as oxygen feed means so as to allow oxygen heated to a predetermined temperature to be mixed into the carrier gas.

Figure 3:
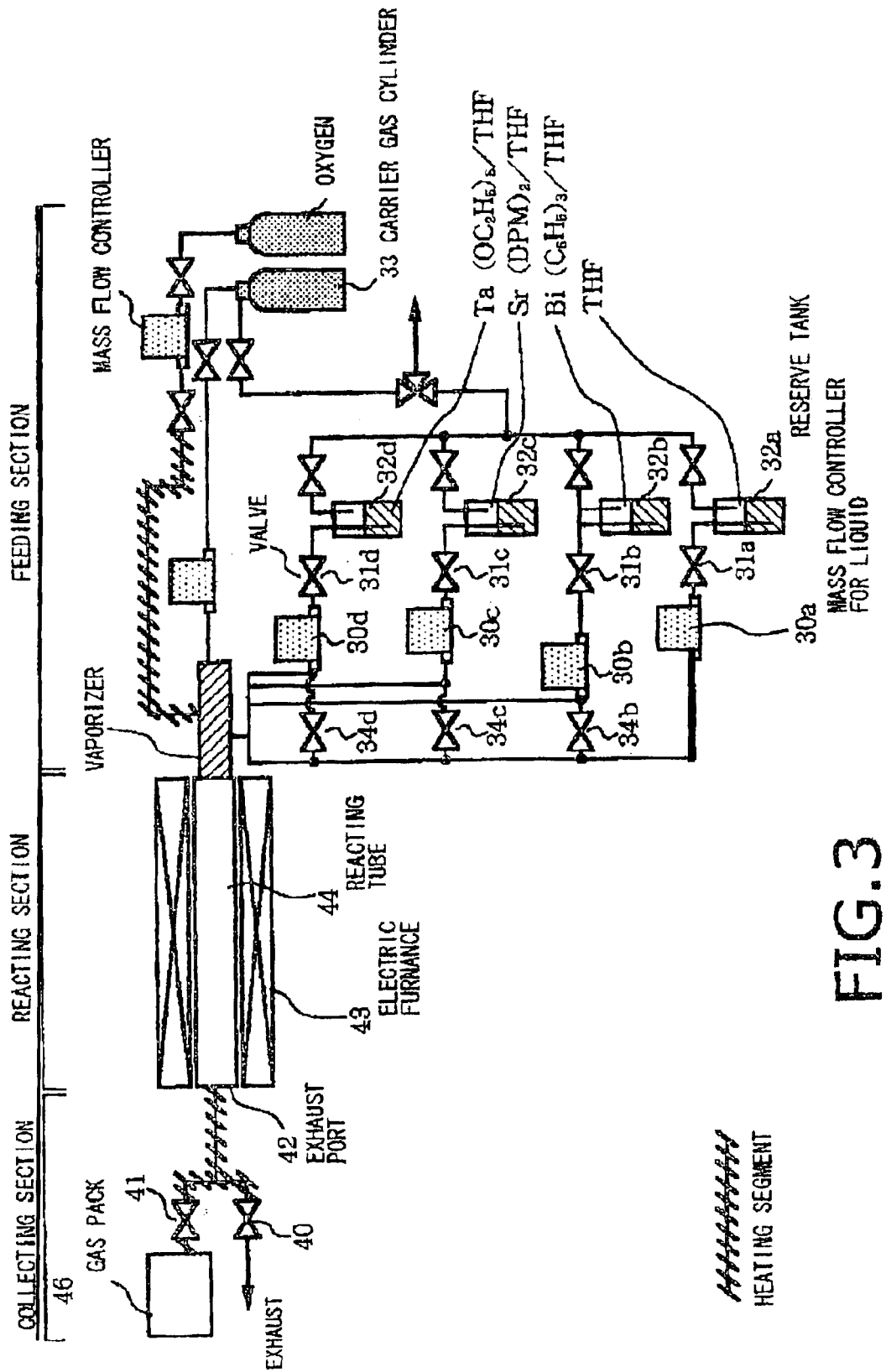
FIG. 3 illustrates an MOCVD system.

Description will first be made of start of feed of the raw material solution to the vaporizer, As shown in FIG. 3, reserve tanks 32a, 32b, 32c and 32d are connected to the raw material feed opening 6 by way of mass flow controllers 30a, 30b, 30c and 30d, respectively, and of valves 31a, 31b, 31c and 31d, respectively.

A carrier gas cylinder 33 is connected to the reserve tanks 32a, 32b, 32c and 32d.

Figure 4:
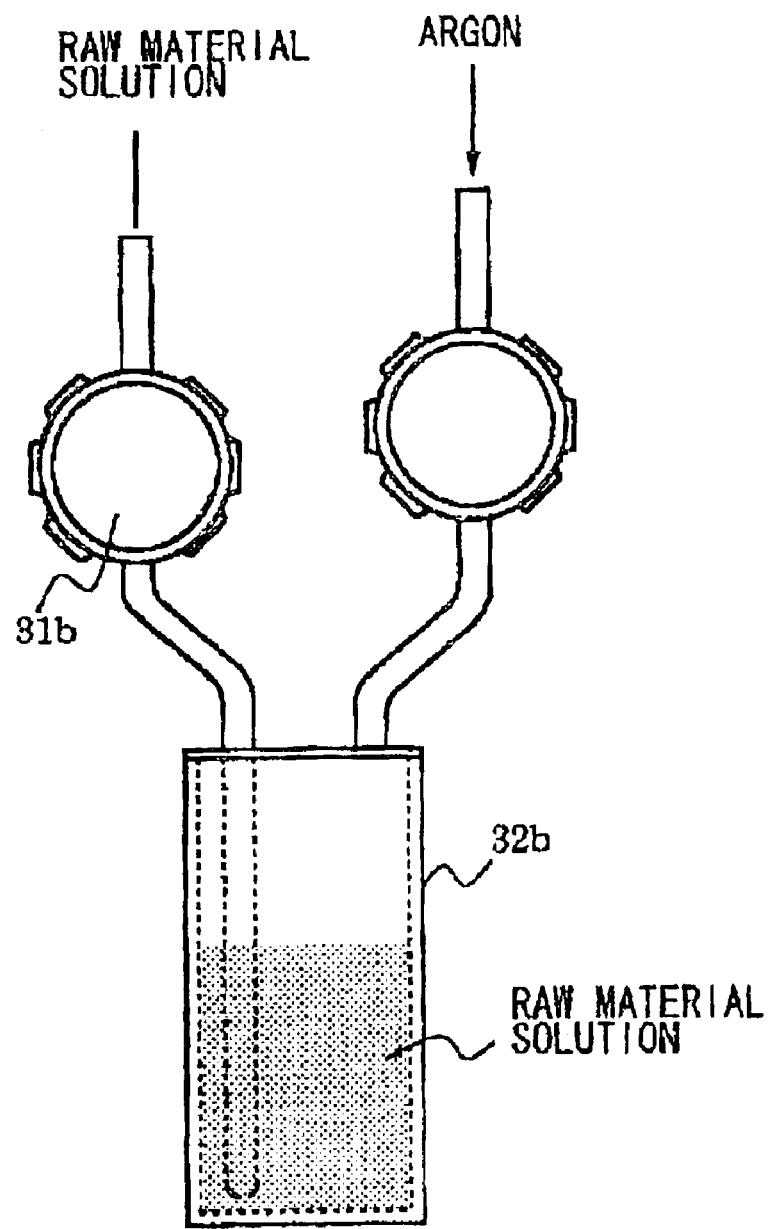
FIG. 4 is a front elevational view of a reserve tank.

Details of the reserve tanks are depicted in FIG. 4.

The reserve tanks are each filled with the raw material solution. 3 kgf/cm² of carrier gas is fed into each reserve tank (made of SUS with internal volume of 300 cc). The interior of the reserve tank is pressurized by the carrier gas so that the raw material solution is pushed up through the tube in contact with the solution and is fed under pressure to the mass flow controller for liquid (made of STEC with full scale flow rate of 0.2 cc/min) by means of which the flow rate is controlled, The raw material solution is further delivered through a raw material feed inlet 29 of the vaporizer to the raw material feed opening 6.

It is then carried to a reacting section by the carrier gas whose flow rate has been controlled to a certain value by means of a mass flow controller (made of STEC with full scale flow rate of 2 L/min). At the same time, oxygen (oxidizing agent) is also delivered to the reacting section, with the flow rate of oxygen being controlled to a certain value by means of a mass flow controller (made of STEC with full scale flow rate of 2 L/min).

The raw material solution contains an organometallic complex which is dissolved in THF as the solvent and is liquid or solid at the normal temperature. Hence, if it is left to stand, the THF solvent will evaporate, allowing the organometallic complex to deposit and finally become solidified. It is therefore envisaged that the interior of the piping in contact with the raw material solution may possibly become clogged thereby. A cleansing line is thus provided under consideration that the interiors of the piping and vaporizer have only to be cleansed by THF after the completion of the film forming work in order to suppress any possible clogging of the piping. Cleansing is performed over the segment extending from the outlet of the mass flow controller for liquid to the vaporizer and includes washing off by THF after the completion of the work.

The valves 31b, 31c and 31d were opened so that the carrier gas was fed under pressure into the reserve tanks 32b, 32c and 32d, respectively. The raw material solution is then delivered under pressure to the mass flow controller (made of STEC with full scale flow rate of 0.2 cc/min) by means of which the flow rate is controlled, the resultant raw material solution being fed to the raw material feed opening 6 of the vaporizer.

On the other hand, the carrier gas was introduced through the gas introduction port of the vaporizer. It is to be noted that too a high pressure of the carrier gas may possibly cause the rod 10 to project. Therefore, the maximum pressure on the feed opening side is preferably 3 kgf/cm² or less. The maximum permissible flow rate at that time is of the order of 1200 cc/min, and the passage flow rate in the gas passage 2 can reach one hundred and several tens of meters per second.

When the raw material solution drips down from the raw material feed opening 6 onto the carrier gas flowing through the gas passage 2 of the vaparizer, the raw material solution is sheared by the high-velocity flow of the carrier gas and becomes ultrafine. As a result of this, the raw material solution is dispersed in the form of ultrafine particles into the carrier gas. The carrier gas (raw material gas) containing the raw material solution dispersed in the form of ultrafine particles is discharged into the vaporizing section 22 while keeping its high velocity.

Three different raw material solutions having flow rates controlled to certain values flow via the respective raw material feed inlets 29 and through the raw material feed opening 6 into the gas passage 2 to move through the gas passage together with the carrier gas in the form of a high-velocity air flow, after which they are discharged into the vaporizing section 22. In the dispersing section 8 as well, the raw material solution is heated by heat from the vaporizing section 22 and vaporization of THF is accelerated, so that the segment from the raw material feed inlets 29 to the raw material feed opening 6 and the segment of the gas passage 2 are cooled down by tap water.

After the discharge from the dispersing section 8, the raw material solutions dispersed in the form of fine particles within the carrier gas are subjected to accelerated vaporization during the delivery through the interior of the vaporizing tube 20 heated to a predetermined temperature by the heater 21 and mix with oxygen heated to a predetermined temperature from the oxygen feed opening 25 provided immediately short of the reaction tube for the MOCK!. The raw material solutions thereby result in mixed gases, which flow into the reaction tube.

A vacuum pump not shown was connected to an exhaust port 42 and was operated for pressure reduction for twenty minutes to remove impurities such as moistures lying within the reaction tube 44, after which a valve 40 downstream of the exhaust port 42 was closed.

Cooling water was supplied to the vaporizer at approximately 400 cc/min. On the other hand, 3 kgf/cm$^2$ of carrier gas was fed at 495 cc/min so that the interior of the reaction tube 44 was fully filled with the carrier gas, after which the valve 40 was opened. The temperature at the gas outlet 7 was lower than 67° C.

The interior of the vaporizing tube 20 was heated to 200° C., the segment from the reaction tube 44 to a gas pack 46 and the gas pack 46 were heated to 100° C., and the interior of the reaction tube 44 was heated to 300° C. to 600° C.

The interior of the reserve tank was pressurized by the carrier gas, and the mass flow controller was used to flow a predetermined liquid therethrough.

Sr(DPM)$_2$, Bi(C$_6$H$_5$)$_3$, Ta(OC$_2$H$_5$)$_5$ and THF were flowed at the flow rate of 0.04 cc/min, 0.08 cc/min, 0.08 cc/min and 0.2 cc/min, respectively.

Twenty minutes later, the valve immediately upstream of the gas pack 46 was opened so that reaction products were collected In the gas pack 46. The reaction products were analyzed by gas chromatograph to see whether detected products coincided with products in the reaction formula examined on the basis of the reaction theory. The result was that in this embodiment the detected products were well coincident with the products in the reaction formula examined on the basis of the reaction theory.

The amount of adhesion of carbides on the external surface of the dispersing section body 1 toward the gas outlet 7 was measured. The result was that the amount of adhesion of carbides was extremely small.

Comparative Example 1

This example used an apparatus similar to the apparatus shown in FIG. 1 but excluding the cooling means therefrom, in order to make similar experiments.

In this example, sufficient coincidence was not obtained between detected products and products in the reaction formula examined on the basis of the reaction theory.

The result of measurement of the amount of adhesion of carbides on the external surface of the dispersing section body 1 toward the gas outlet 7 was about five times the amount of adhesion of carbides in the case of the embodiment 1.

Embodiment 2

Figure 5:
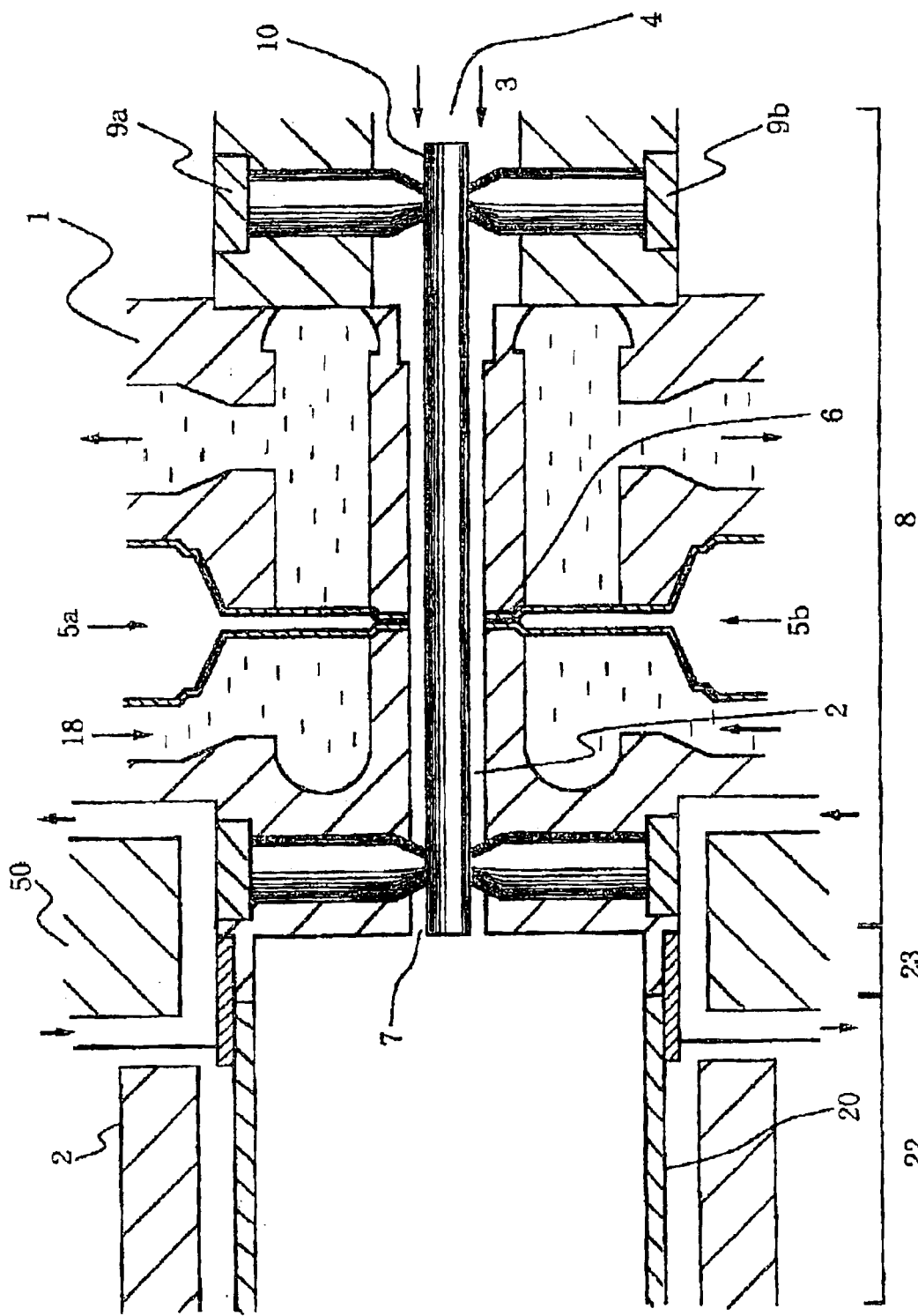
FIG. 5 is a sectional view of the major part of a vaporizer for MOCVD in accordance with embodiment 2.

FIG. 5 illustrates a vaporizer for MOCVD in accordance with embodiment 2.

In the embodiment 1 the connecting section 23 was also subjected to heating by the heater 21, whereas in this embodiment the heater was provided only around the external periphery of the vaporizing section 22. Instead, cooling means 50 were provided around the external periphery of the connecting section 23 to cool the connecting section 23.

The others were the same as the embodiment 1.

In this embodiment, better coincidence was obtained than in the case of the embodiment 1 between detected products and products in the reaction formula examined on the basis of the reaction theory.

The result of measurement of the amount of adhesion of carbides on the external surface of the dispersing section body 1 toward the gas outlet 7 was about one third the amount of adhesion of carbides in the case of the embodiment 1.

Embodiment 3

Figure 6:
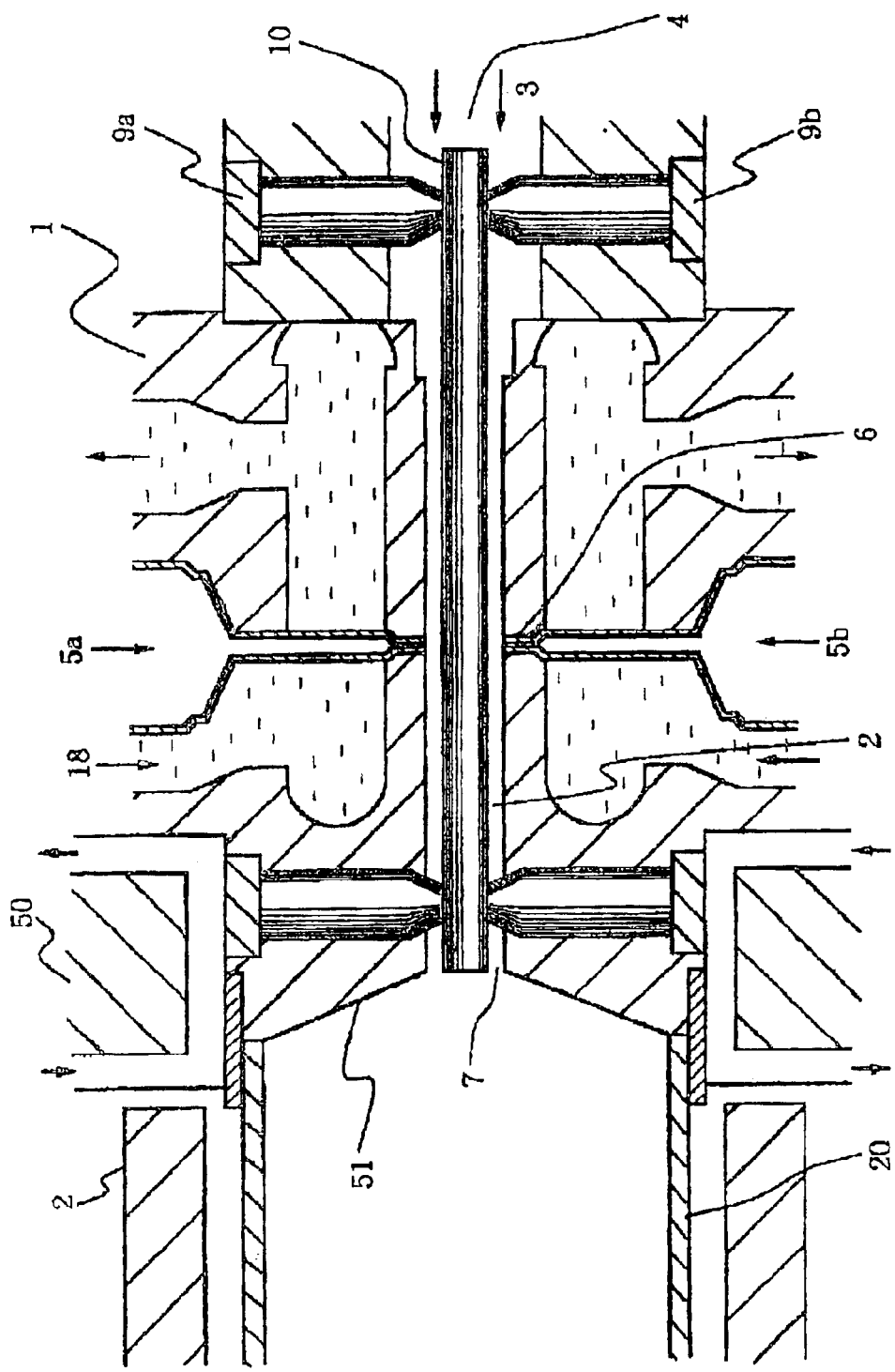
FIG. 6 is a sectional view of the major part of a vaporizer for MOCVD in accordance with embodiment 3.

FIG. 6 illustrates a vaporizer for MOCVD in accordance with embodiment 3.

in this embodiment, the interior of the connecting section 23 has a tapered portion 51 with larger inner diameters from the dispersing section 8 toward the vaporizing section 22, Such a tapered portion 51 serves to eliminate any dead zones and contributes to the prevention of possible residence of the raw material.

The others were the same as the embodiment 1.

In this embodiment, better coincidence was obtained than in the case of the embodiment 2 between detected products and products in the reaction formula examined on the basis of the reaction theory.

Measurement of the amount of adhesion of carbides on the external surface of the dispersing section body 1 toward the gas outlet 7 resulted in substantially no adhesion of carbides.

Embodiment 4

Figure 7A:
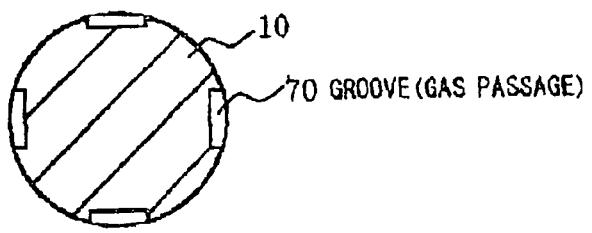
FIGS. 7A and 7B are cross-sectional view showing variants, in accordance with embodiment 4, of the gas passages of the vaporizer for MOCVD.
Figure 7B:
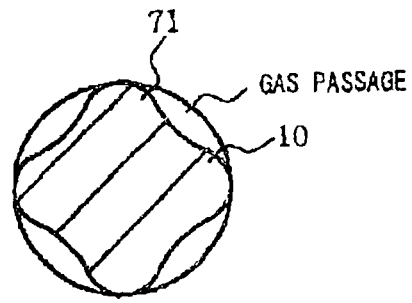

FIGS. 7A and 7B illustrate a modification of the gas passage.

In FIG. 7A, the rod 10 has the surface provided with grooves 70 and has the outer diameter substantially equal to the inner diameter of the bore formed in the interior of the dispersing section body 1. Thus, by merely fitting the rod 10 into the bore, it is possible to position the rod 10 in the bore without permitting any eccentricity. There is no need to use screws. The grooves 70 serve as gas passages.

It will be understood that a plurality of grooves 70 may be formed in such a manner as to extend in parallel with the longitudinal axis of the rod 10 although a spiral groove may be formed around the surface of the rod 10. In the case of the spiral groove, a more uniform raw material gas will be obtained.

In the embodiment of FIG. 7B, the rod 10 is provided with protrusions. The maximum diameter of the protrusions is substantially equal to the inner diameter of the bore formed in the interior of the dispersing section body 1. Gas passages are spaces defined by the protrusions and the internal surface of the bore.

Although FIGS. 7A and 7B illustrate the rod 10 having the machined surface by way of embodiment, it is natural that the rod maybe of a circular section, with the bore being formed with recesses to define the gas passages.

Embodiment 5

Embodiment 5 is then described with reference to FIG. 8.

The vaporizer of this embodiment is constituted of a dispersing section 8 and a vaporizing section 22. The dispersing section 8 comprises a gas passage formed in the interior, a gas introduction port 4 for introducing a carrier gas 3 under pressure into the gas passage, means for feeding raw material solutions 5a and 5b to the gas passage, and a gas outlet 7 for delivering the carrier gas 3 containing the raw material solutions 5a and 5b to the vaporizing section 22. The vaporizing section 22 comprises a vaporizing tube 20 having one end connected to a reaction tube of the MOCVD system and having the other end connected to the gas outlet 7 of the dispersing section 8, and heating means for heating the vaporizing tube 20. The vaporizing section 22 serves to heat and vaporize the raw material solution containing carrier gas 3 delivered from the dispersing section 8. The dispersing section 8 includes a dispersing section body 1 having a cylindrical hollow portion, and a rod 10 having an outer diameter smaller than the inner diameter of the cylindrical hollow portion. The rod 10 has one or more spiral grooves 60 formed in the external periphery closer to the vaporizing section 22, the rod 10 being inserted into the cylindrical hollow portion.

When the raw material solutions 5a and 5b are Ted to the gas passage through which the carrier gas 3 flows at a high velocity, the raw material solutions are sheared and atomized. That is, the raw material solutions in the form of liquid are sheared and reduced to particles by the high-velocity flow of the carrier gas. The particulate raw material solutions are dispersed as fine particles into the carrier gas. In this respect, the embodiment 5 is similar to embodiment 1.

In order to optimize the shearing and atomization, the following conditions are preferred.

The raw material solutions 5a and 5b are fed at preferably 0.01 to 1 cc/min, more preferably 0.05 to 0.5 cc/min, and most preferably 0.1 to 0.3 cc/m n. In the case of simultaneous feed of a plurality of raw material solutions (inclusive of the solvent), the rate of feed is represented by the total amount thereof.

The carrier gas is fed at the rate of preferably 50 to 300 m/esc and more preferably 100 to 200 m/sec.

In this embodiment, the rod 10 has on its external periphery a spiral groove 60, with the presence of a gap space defined between the dispersing section body 1 and the rod 10, whereby the carrier gas containing the atomized raw material solutions can flow straight as a straightforward flow through the gap space and can form a spiral flow along the spiral groove 60.

The inventors have thus found out that the atomized raw material solutions can uniformly disperse into the carrier gas in the state where the straightforward flow and the spiral flow are coexistent. It is not necessarily apparent why the uniform dispersion can be obtained when the straightforward flow and the spiral flow coexist. The reason may however be envisaged as follows. The presence of the spiral flow allows a centrifugal force to act on the flow, with the result that a secondary flow will occur. The secondary flow accelerates the mixture of the raw material solutions and the carrier gas. More specifically, the centrifugal effect of the spiral flow causes a secondary, derivative flow to be generated in the direction perpendicular to the flow, whereupon the atomized raw material solutions will disperse more uniformly into the carrier gas.

This embodiment will hereinafter be described in greater detail.

In this embodiment, four different raw material solutions 5*a*, 5*b*, 5*c* and 5*d* (5*a* to 5*c* are organometallic raw materials, and 5*d* is a solvent raw material such as THF) are fed to the gas passage by way of embodiment.

In order to mix the carrier gas (referred to as "raw material gas") containing raw material solutions which have each been atomized and reduced to ultrafine particles, the rod 10 of this embodiment is provided with a spiral groove free portion downstream of the portion corresponding to the raw material feed opening 6. This spiral groove free portion forms a premixing section 65. In the premixing section 65 the three different organometallic raw material gases are mixed to some extent, and in the downstream region of spiral structure they are reduced to a perfect raw material mixture gas. To attain a uniform raw material mixture gas, the length of this mixing section 65 is preferably within a range from 5 to 20 mm, and more preferably 8 to 15 mm. Outside of this range, the vaporizing section 22 may accept a raw material mixture gas having a higher concentration of only one organometallic raw material gas of the three.

In this embodiment, the upstream end portion 66 of the rod 10 is provided with a parallel portion 67 and a tapered portion 58. In a manner corresponding to the parallel portion 67 and the tapered portion 58, the cylindrical hollow portion of the dispersing section body 1 is also provided with a parallel portion having the inner diameter equal to the cuter diameter of the parallel portion of the rod 3.0 and with a tapered portion having the same taper as that of the tapered portion of the rod 10. Thus, by inserting the rod 10 from left in the diagram, the rod 10 can be retained in the hollow portion of the dispersing section body 1.

Unlike the case of the embodiment 1, this embodiment employs the rod 10 provided with the taper for retention so that the rod 10 is prevented from being displaced upon the use of a high-pressure carrier gas exceeding 3 $kgf/cm^2$. In other words, employment of the retention technique shown in FIG. 8 ensures that the carrier gas can flow under a pressure equal to or higher than 3 $kg/cm^2$. As a result of this, it becomes possible to feed a higher velocity of carrier gas. Thus, it becomes also possible to feed a high-velocity carrier gas of 50 to 300 mm/s. The same will apply to the other embodiments set forth hereinabove by employing this retention technique.

It is to be noted that at the portion corresponding to the raw material feed opening 6 the rod 10 is formed with grooves 67*a*, 67*b*, 67*c* and 67*d* acting as carrier gas passages as seen in FIG. 9B. The depth of the grooves 67*a*, 67*b*, 67*c* and 67*d* is preferably 0.005 to 0.1 mm. The depth less than 0.005 mm will make the groove forming work difficult. More preferably, the range of depth is 0.01 to 0.05 mm. This range can obviate any possible clogging or other inconveniences. A high-velocity flow is also easy to obtain.

The features of the embodiment 1 shown in FIG. 1 or other features may be employed for the retention of the rod 10 and formation of the gas passage(s).

A single spiral groove 60 may be formed as shown in FIG. 9A, but instead a plurality of spiral grooves 60 may be formed as shown in FIG. 10. In the case of formation of the plurality of spiral grooves, they may cross. In the event of crossing, a more uniformly dispersed raw material gas is obtained.

The dimensions and contours of the spiral groove(s) 60 are not limited to any particular ones, although FIG. 9C depicts one example thereof.

It is to be noted in this embodiment that the gas passage is cooled by the cooling water 18 as shown in FIG. 8.

In this embodiment, an expanding section 69 is separately provided upstream of the entrance to the dispersing section 22. This expanding section 69 corresponds to the portion provided for preventing the residence of the raw material gas in the embodiment 3. It is natural that the expanding section 69 may not necessarily be separately provided but that it may be integrally formed as shown in FIG. 6.

The angle θ of expansion of the expanding section 69 is preferably within a range from 5 to 10 degrees. In case the angle θ lies within this range, it is possible to feed the raw material gas to the dispersing section without breaking the spiral flow. Additionally, in case the angle θ lies within this range, the fluid resistance due to the expansion is minimized, with the minimum presence of dead zones so that the occurrence of eddy flows due to the presence of the dead zones can be minimized. More preferably, the angle θ is within a range from 6 to 7 degrees. The embodiment shown in FIG. 6 has also the same preferred range of θ.

Embodiment 6

In order to examine the uniformity of the raw material gas, the apparatus shown in FIG. 8 was used to feed the raw material solutions and carrier gas under the following conditions. Amount of drip-feed of raw material solutions:

|  | 2 | 2 |
|---|---|---|
| Sr (DPM)$_2$ | 0.04 cc/mm | |
| Bi (C$_6$H$_5$)$_3$ | 0.08 cc/mm | |
| Ta (OC$_2$H$_5$)$_5$ | 0.08 cc/mm | |
| THF | 0.2 cc/mm | |

Carrier gas:
  nitrogen gas 10 to 350 m/s

Figure 8:
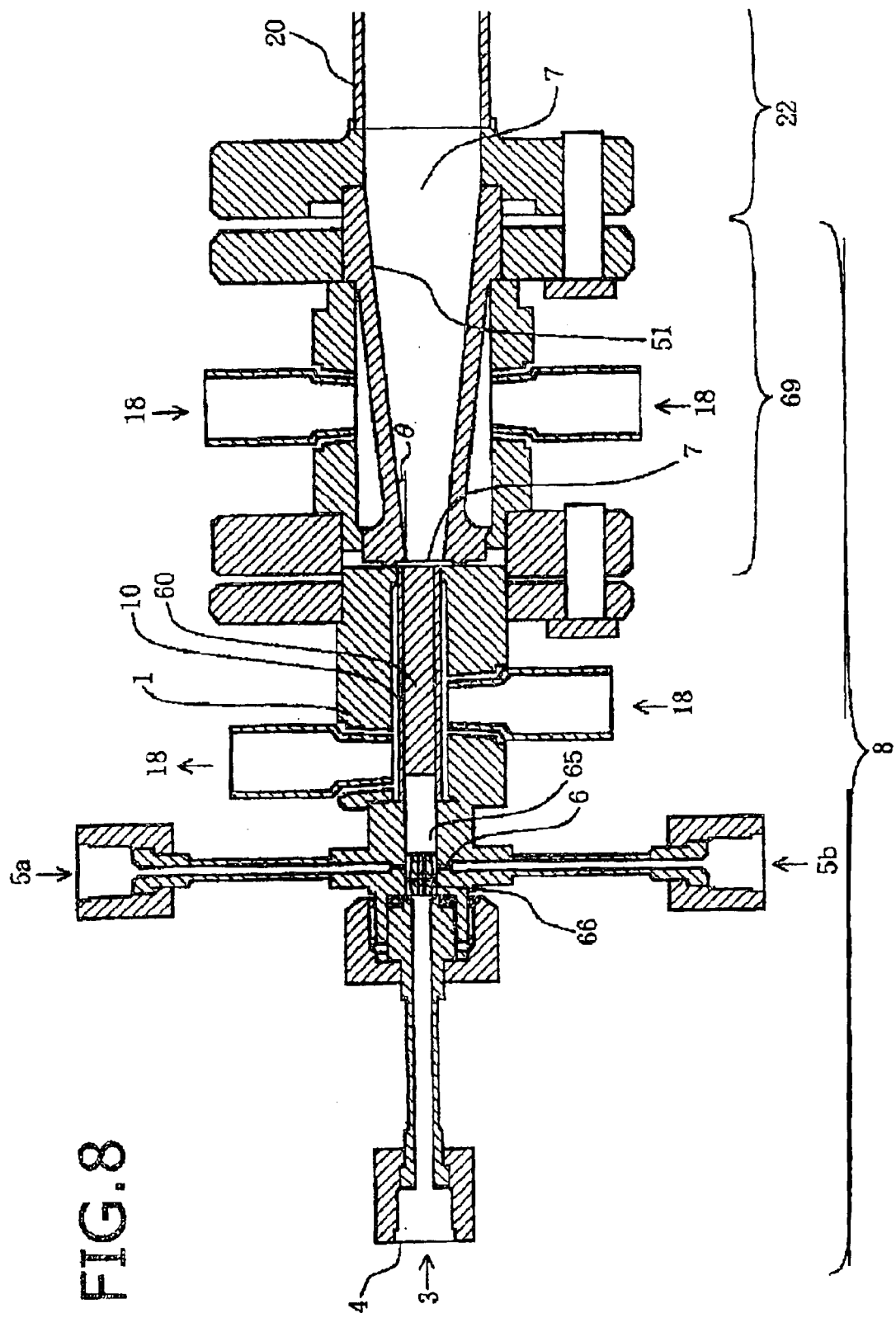
FIG. 8 is a sectional view of a vaporizer for MOCVD in accordance with embodiment 5.
Figure 9A:
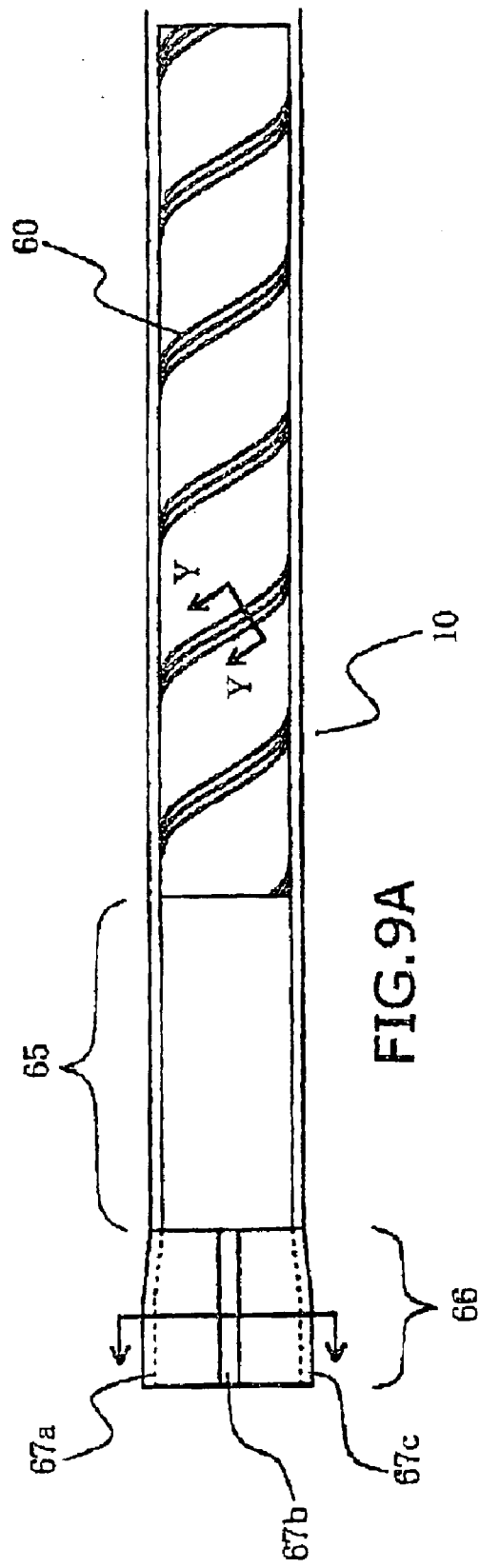
FIGS. 9A to 9C are a side elevational view, a sectional view taken along a line X—X of FIG. 9A, and a sectional view taken along a line Y—Y of FIG. 9A, respectively, of a rod for use in the vaporizer for MOCVD in accordance with the embodiment 5.
Figure 9C:
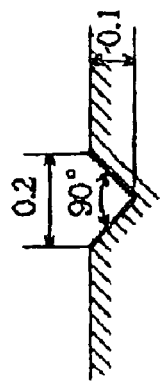
Figure 9B:
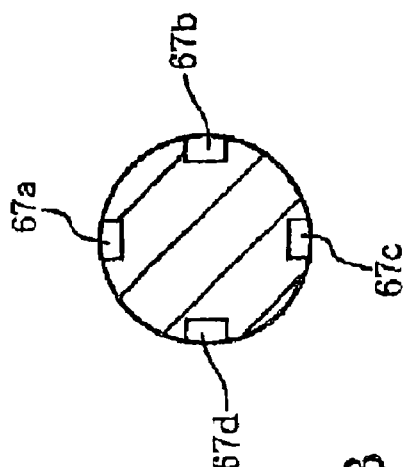
Figure 10:
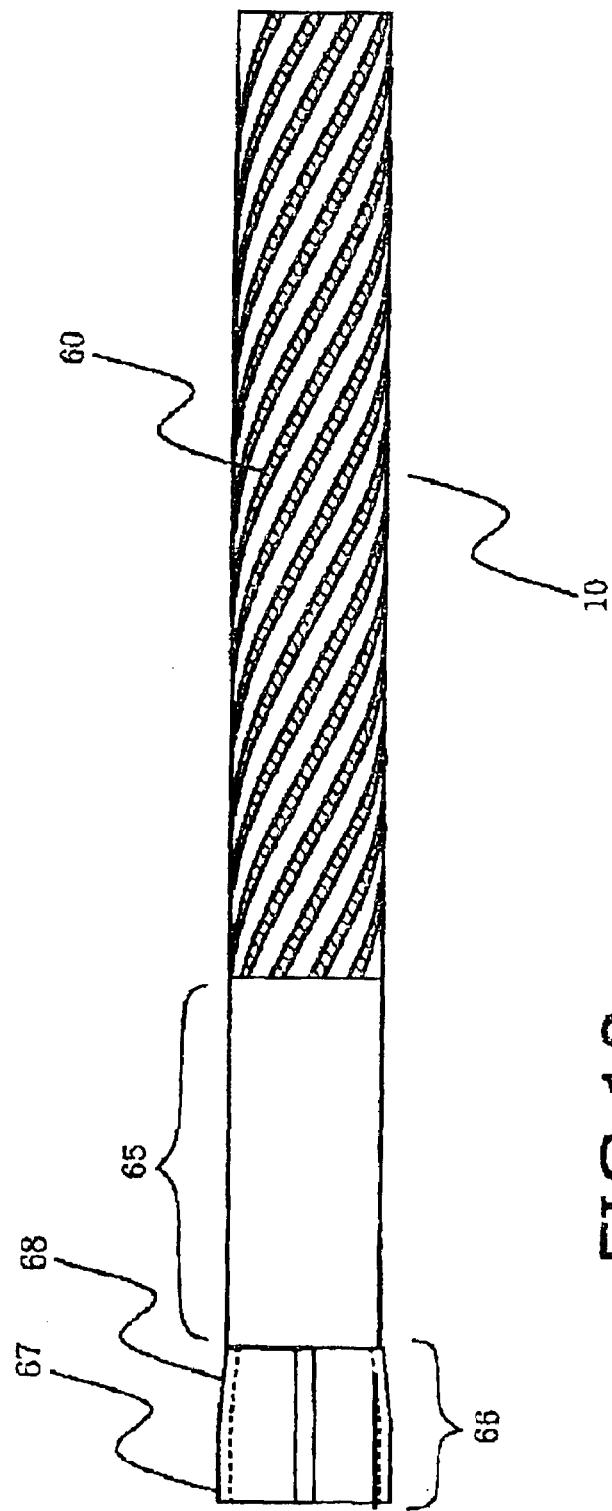
FIG. 10 is a side elevational view of a variant of the rod shown in FIG. 9A.

The vaporizer used was the apparatus shown in FIG. 8. Used as the rod was a rod similar to that shown in FIGS. 9A to 9C but having no spiral grooves.

The raw material solutions were fed through the raw material feed opening 6, with the carrier gas being fed at various speeds. Through the raw material feed opening, Sr(DPM)$_2$, Bi(C$_6$H$_5$)$_3$, Ta(OC$_2$H$_5$)$_5$ and THF were fed to grooves 67a, 67b, 67c and 67d, respectively.

The vaporizing section was not subjected to heating. The raw material gas was sampled at the gas outlet 7. Measurement was made of particle diameters of raw material solutions in the sampled raw material gas.

Figure 11:
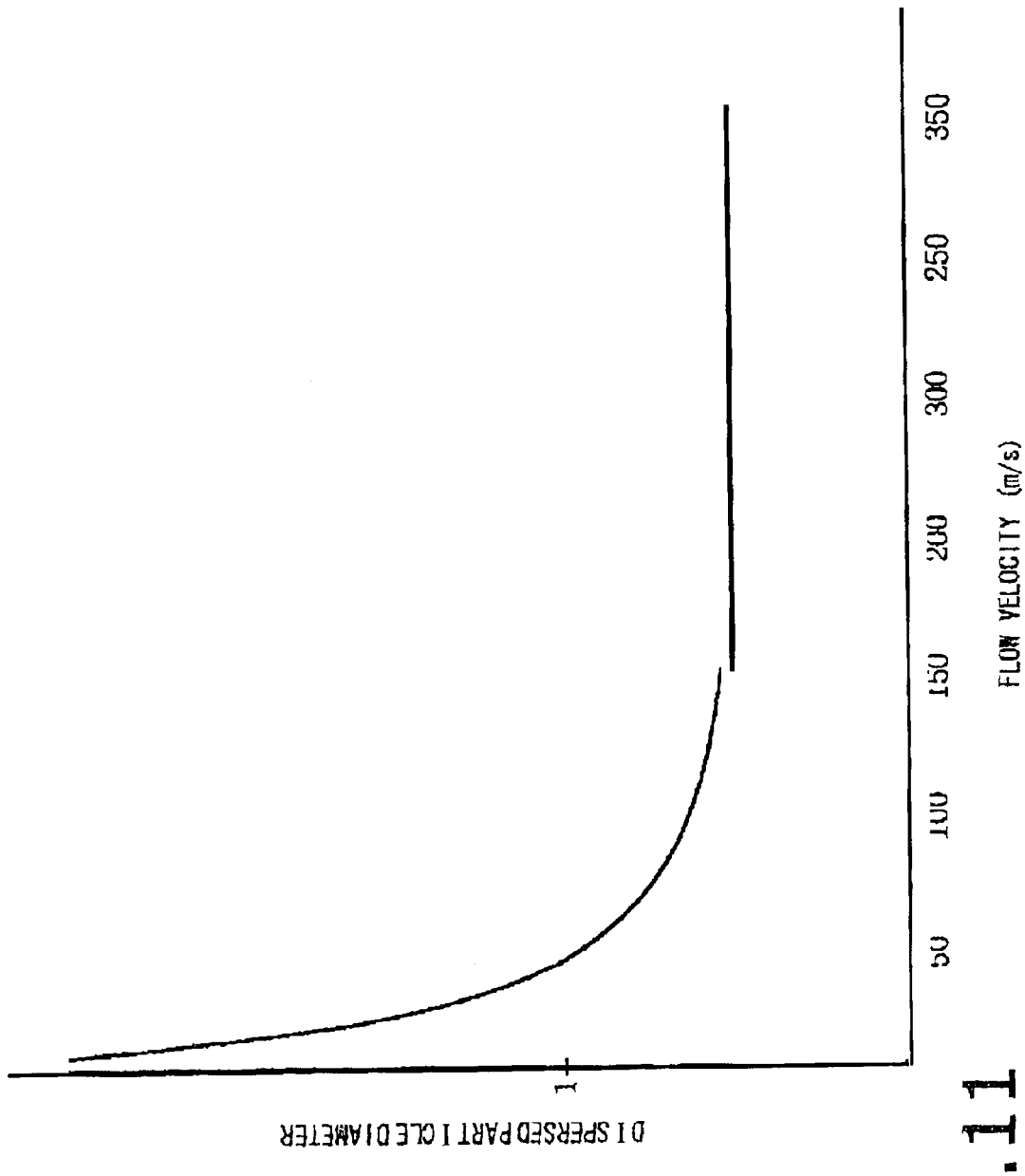
FIG. 11 is a graphic representation of the results of experiments effected in embodiment 6.
Figure 12B:
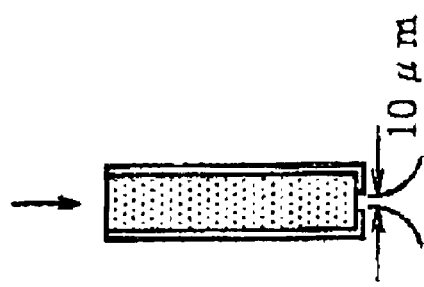
FIGS. 12A and 12B are schematic sectional side elevations of the conventional vaporizer for MOCVD.
Figure 12A:
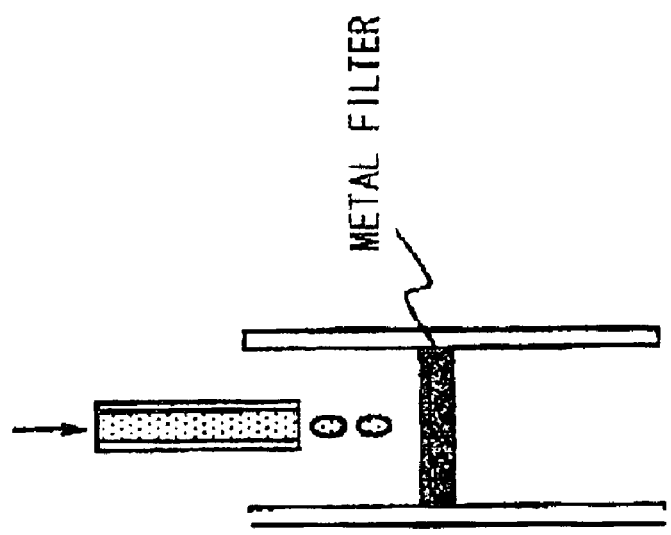

The results are shown as relative values in FIG. 11 (where 1 represents a value obtained when the apparatus in accordance with the conventional example was used). As is apparent from FIG. 11, the diameters of dispersed particles become small when the flow velocity exceeds 50 m/s, and the dispersed particle diameters become even smaller when 100 m/s is exceeded. At the velocity exceeding 200 m/s, however, the diameters of the dispersed particles become saturated. A more preferred range is therefore 100 to 200 m/s.

Embodiment 7

In this embodiment, the spirally grooved rod was used. The others were the same as the embodiment 6.

In the embodiment 6, the raw material solutions fed to the grooves had high concentrations in the extensions of the grooves. More specifically, the concentrations of Sr(DPM)$_2$, Bi(C$_6$H$_5$)$_3$ and Ta(OC$_2$H$_5$)$_5$ were high at their respective extensions of the grooves 67a, 67b and 67d, respectively.

In this embodiment, however, the raw material mixture gas obtained at the end of the spiral groove contained uniform organometallic raw materials at every portions.

According to the present invention there can be provided a vaporizer for MOCVD capable of long-term use without causing any clogging or other inconveniences and ensuring a stable feed of raw materials to the reacting section.

According to the present invention there can be obtained a vaporized gas containing uniformly dispersed organometallic materials.

What is claimed is:

1. A method of vaporizing a raw material solution for MOCVD, comprising the steps of:
   introducing said raw material solution to a gas passage at a rate of 0.01 to 1 cc/mm;
   jetting a carrier gas into said gas passage at the flow velocity of 50 to 300 m/s to thereby shear and atomize said raw material solution to obtain a raw material solution gas; and
   delivering said raw material solution gas to a vaporizing section for vaporization.

2. A method of vaporizing a raw material solution for MOCVD according to claim 1, wherein downstream of the portion of said gas passage where introduction of said raw material solution occurs, said carrier gas or said raw material solution gas flows in a coexistent manner as a spiral flow and a straight forward flow flowing over said spiral flow.

3. A method of vaporizing a raw material solution for MOCVD according to claim 1, wherein said raw material gas is cooled in the region from the portion introduced with said raw material solution up to said vaporizing section.

4. A method of vaporizing a raw material solution for MOCVD according to claim 3, wherein downstream of the portion of said gas passage where introduction of said raw material solution occurs, said carrier gas or said raw material gas flows in a coexistent manner as a spiral flow and a straight forward flow flowing over said spiral flow.

5. A method of vaporizing a raw material solution for MOCVD according to claim 1, wherein said raw material gas is cooled before being introduced to said gas passage.

* * * * *